United States Patent [19]
Bell et al.

[11] Patent Number: 4,996,523
[45] Date of Patent: Feb. 26, 1991

[54] ELECTROLUMINESCENT STORAGE DISPLAY WITH IMPROVED INTENSITY DRIVER CIRCUITS

[75] Inventors: Cynthia S. Bell, Webster; Michael J. Gaboury, Spencerport, both of N.Y.

[73] Assignee: Eastman Kodak Company, Rochester, N.Y.

[21] Appl. No.: 260,103

[22] Filed: Oct. 20, 1988

[51] Int. Cl.$^5$ .............................................. G09G 3/30
[52] U.S. Cl. .................................. 340/781; 340/782; 340/767; 340/793
[58] Field of Search ............... 340/781, 782, 762, 767, 340/793

[56] References Cited

U.S. PATENT DOCUMENTS

| | | | |
|---|---|---|---|
| 3,696,393 | 10/1972 | McDonald | 340/782 |
| 3,740,570 | 6/1973 | Kaelin et al. | 340/793 |
| 4,688,030 | 8/1987 | Uemura et al. | 340/781 |

OTHER PUBLICATIONS

Tannas, "Flat-Panel Displays and CRTs", Van Nostrand Reinhold Company, New York, 1985, pp. 16–17.

Primary Examiner—Alvin E. Oberley
Attorney, Agent, or Firm—Edward Dugas

[57] ABSTRACT

In the present invention a matrix array of organic electroluminescent storage display elements along with row and column selection circuitry are used to select the particular display elements within the matrix to be illuminated. Interposed between the column and row selection electronics are a plurality of memory cells receiving as inputs bit values that correspond to the desired intensity requested from a display element. The memory cells output activation signals which drive corresponding MOS switches each of which in turn is parallel connected as part of a current driver source feeding a single display element. Activation of one or more of the MOS switches provides a controlled amount of current to be applied to the display element to in turn provide a related amount of light from the display element.

7 Claims, 2 Drawing Sheets

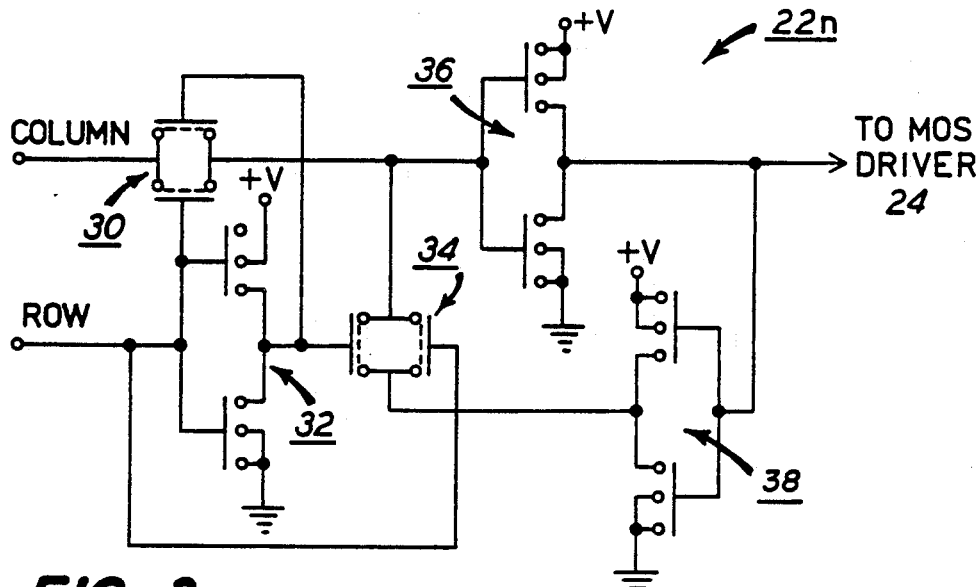
FIG. 3
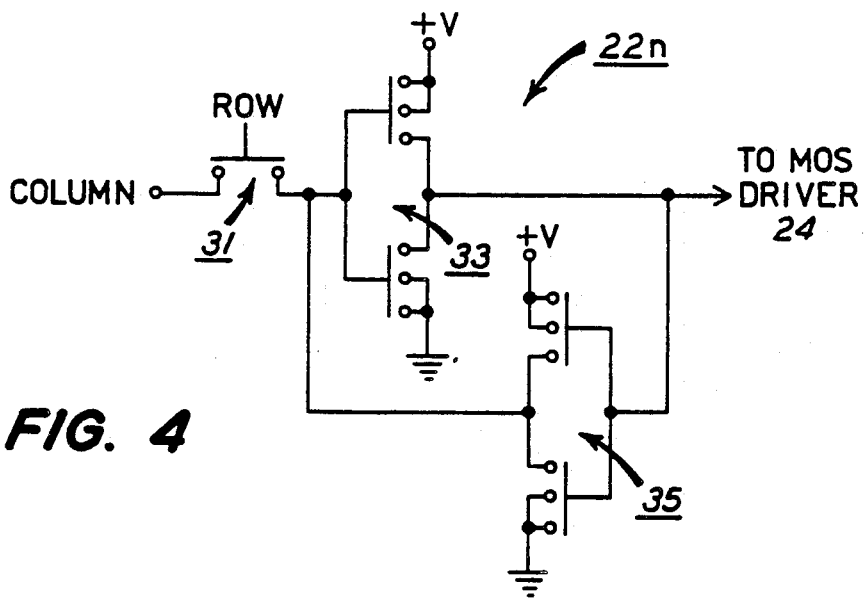
FIG. 4
FIG. 5
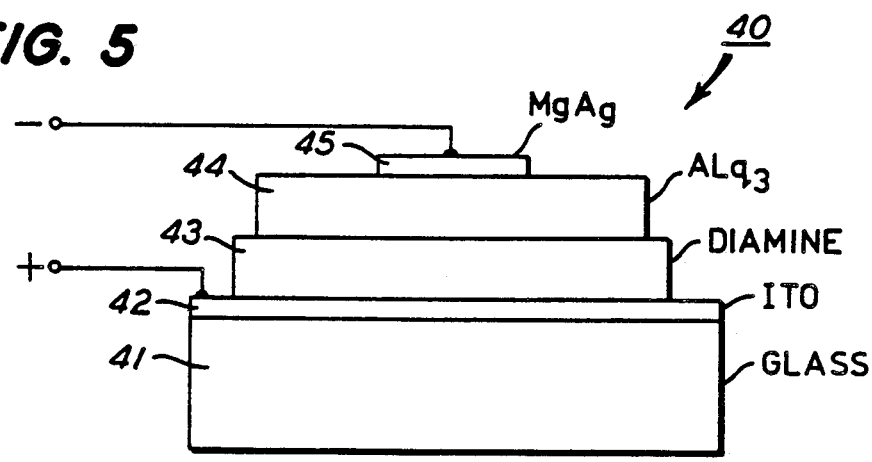

ELECTROLUMINESCENT STORAGE DISPLAY WITH IMPROVED INTENSITY DRIVER CIRCUITS

I. TECHNICAL FIELD OF THE INVENTION

The present invention relates to the field of thin film electroluminescent display devices and, more particularly, to organic electroluminescent display devices with driver circuitry.

II. BACKGROUND OF THE INVENTION

Electroluminescence is the emission of a light from a luminescent material when an electrical field of proper value is applied to the material. This property has been utilized in the prior art to construct display panels. The first wave of devices were of the AC type which used the luminescent material as the dielectric in a parallel plate capacitor where one of the parallel plates was transparent. When an alternating voltage was applied to the parallel plates the luminescent material emitted light. By depositing rows of conductive material on one surface of the luminescent material and columns of conductive material on the opposite surface, an X-Y matrix is formed. At each crossover point of a column and a row a pixel for a video display is formed. With the proper excitation at the crossover points the pixel positioned at that point will emit light. Drive circuits are then coupled to the rows and the columns to vary the level of current or voltage that is applied as a function of the amount of light that is to be generated by each pixel.

Advances in the electroluminescent material art have led to organic materials being used in such type displays which materials provide high brightness levels, and low DC voltage requirements along with multicolors. In addition, recent developments have resulted in display panels with a high density of addressable pixels. With such displays, it is desirable to be able to store imaging data so that the display can be operated without external memory and without continual refreshing. In addition, it would be advantageous to be able to control the brightness of the display with binary signals rather than analog signals thereby permitting the display to be driven by a computer.

SUMMARY OF THE INVENTION

It is an object of the present invention to provide an electroluminescent matrix addressable display with improved driver circuits.

It is another object of the present invention to provide driver circuits with memory for an improved electroluminescent matrix display.

It is a further object of the present invention to provide an electroluminescent matrix display incorporating driver circuitry for selecting multiple levels of drive currents.

According to one aspect of the present invention, each organic electroluminescent pixel element in a matrix of organic electroluminescent pixel elements is provided with a plurality of memory cells for receiving a corresponding plurality of binary input bits. The output of each memory cell is connected to a current driver such that each memory cell controls a portion of the total current applied to the pixel element. Each memory cell activates a MOS transistor to place it into parallel circuit with other activated MOS transistors such that the combination of parallel activated transistors controls the current flowing to the pixel element and in turn the intensity of the light generated by the pixel element. The memory driver circuit for each pixel element thus acts as a memory cell, a D/A converter, and as an electronic switch for controlling the current supplied to the pixel element. This particular driver configuration allows for a continuous, static current to be driven through the pixel element for each brightness level in response to a binary number. In turn, this reduces the peak drive current required to ligh the pixel elements and indirectly reduces the voltage and the power consumption levels for a matrix display incorporating the improved intensity drivers.

BRIEF DESCRIPTION OF THE DRAWINGS

FIG. 3 is a transistor level schematic of a memory cell that may be used as a memory cell of a FIG. 2.

FIG. 4 is a transistor level schematic of a memory cell which also may be used as a memory cell of FIG. 2.

FIG. 5 is a drawing of the layers of one type of electroluminescent device that can be used as the pixel element in a matrix of such elements.

DESCRIPTION OF THE PREFERRED EMBODIMENT

Figure 1:
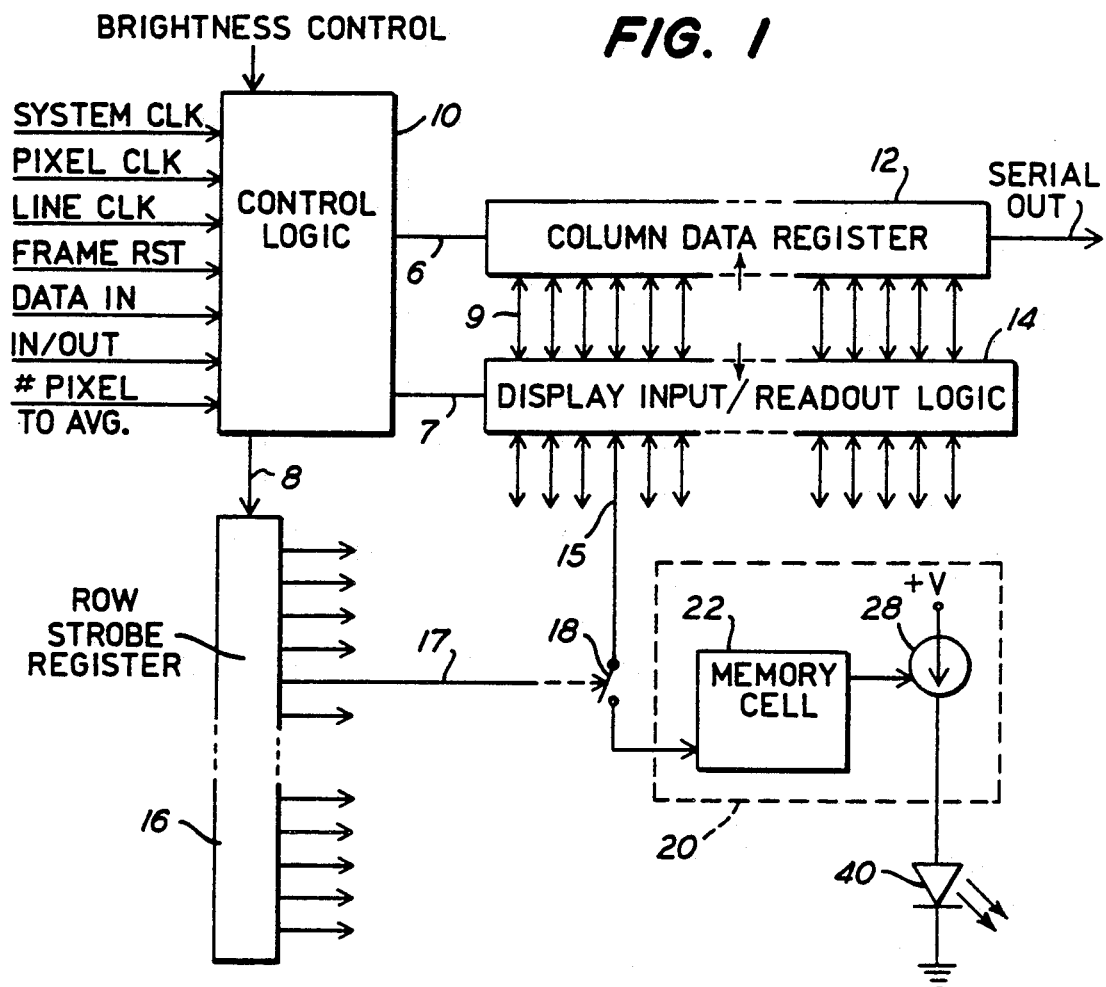
FIG. 1 is a block diagram illustrating the arrangement of an addressable matrix display incorporating the improved driver circuits.

In FIG. 1, a control logic circuit 10 receives incoming data (DATA IN) and other interface timing signals. The control logic synchronizes the incoming data with the signals PIXEL CLK, LINE CLK, and FRAME RST as is standard procedure. A SYSTEM CLK signal provides a high speed clock for controller internal timing. An IN/OUT line allows data to be read in and out of the memory storage. This mode is also useful in automating the testing of the display circuitry. The #PIXEL TO AVG. signal allows data from sources of varying resolution to be displayed. Normally, the data would be subsampled or otherwise pre-processed external to the display system. This feature allows the data to be averaged while it is incoming direct from the data source. A BRIGHTNESS CONTROL allows for an adjustment of the display brightness level for various applications. The level of this input may be controlled, for example, by a user through a potentiometer, by a light meter circuit, or by other means.

Outputs from the control logic circuitry are directed to a column data register 12, a display input/readout logic circuit, and a row strobe register 16 over lines 6, 7, and 8, respectively. The parallel outputs 9 from the column data register 12 are connected to the display input/readout logic 14 to provide bidirectional data paths there between. The display input/readout logic 14 has a corresponding number of bidirectional lines output 15.

The row strobe register 16 has a number of output lines 17 corresponding in number to the number of rows in a driven display matrix.

A memory driver circuit 20 is connected to a column line 15 by means of a MOS switch 18 when the row line 17 associated with a memory driver circuit is selected (energized). The output of the memory driver circuit 20 is connected to an electroluminescent cell 40 (pixel element).

An image display is formed by physically positioning a plurality of these pixel elements 40 closely together, generally in a matrix configuration of rows and columns or by forming the pixel elements 40 in a VLSI multilayer type structure.

Each pixel element is provided with its own memory driver circuit 20. Within each memory driver circuit there is a memory cell 22 that is connected on its input via the switch 18 to the line 15. The output of the memory cell is connected to a current drive source 28. The current driver source is powered by a voltage supply +V to provide a driving current to the pixel element 40. The magnitude of the driving current is controlled by the output signal from the memory cell 22 which magnitude in turn determines the brightness level of the light emitted by the pixel element 40.

The combination of an active IN signal and FRAME RST signal causes the controller 10 to load in new data for display. This is accomplished by setting the display input/readout 14 to its read-in state with an enable signal on line 7. The incoming data is averaged as directed by the #PIXEL TO AVG. signal, and then passed on to the memory driver circuitry 20. This is done by conveying the data serially to the column data register 12 over line 6 in a line-by-line fashion. When an entire line has been conveyed, the control logic sends out a pulse to the row strobe register 16 over line 8, which closes the transistor switch(s) 18 associated with that row, thereby enabling the transfer of column data to the memory cell(s) 22. Following the loading of the data, the row switch(s) 18 are re-opened and the next line is loaded.

The combination of an active OUT signal and FRAME RST signal cause the control logic to set the display input/readout 14 to its read-out state. As each row strobe line 17 is enabled, and the logical state of each memory cell 22 is sensed on each column line 15, the data in each memory cell is transferred in parallel to the column data register 12 which serially conveys the data out, line-by-line on the serial out line.

Figure 2:
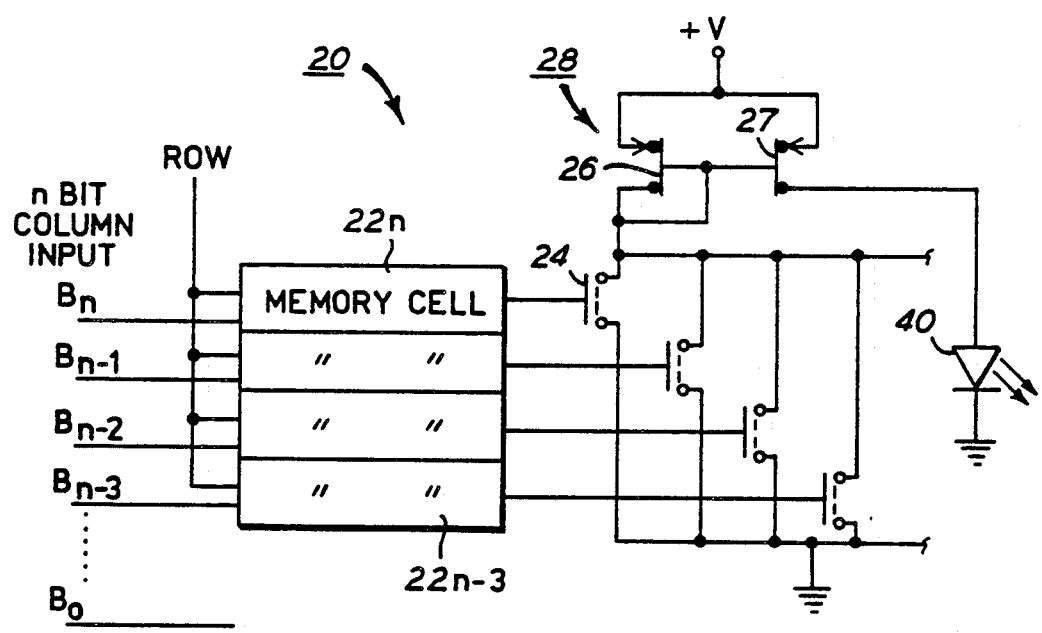
FIG. 2 is a block circuit diagram of an improved driver circuit of the type used in FIG. 1.

In FIG. 2 a group of memory cells, $22n$ through $22n-3$, responding to binary bit signals, $B_n$ through $B_{n-3}$ activate one or more MOS transistors 24. The MOS transistors 24, 26, and 27 form the current driver 28 for driving the pixel element 40. The MOS transistors 26 and 27 are connected and sized to function as current mirrors, that is, the current through MOS transistor 27, which can be called $I_{pixel}$, is equal to the current flowing through MOS transistor 26, which current can be called $I_2$. The current $I_2$ is a function of the number of MOS transistor 24 that are turned ON or OFF (actively connected in parallel). With all MOS transistors 24 turned ON the highest level of current flows through the pixel element 40. With all of the MOS transistors 24 in an OFF state the pixel element 40 is not illuminated.

Generally speaking, when devices 26 and 27 are the same size the following relationship holds true: $I_{pixel} = I_2 + I_n + I_{n+1} + \ldots$.

If each MOS transistor is fabricated to have a different current flow when it is ON then a selection can be made as to which transistors are turned ON, in combination, to achieve the desired intensity level.

Selection of the MOS transistors 24 is accomplished by applying an enable signal to the ROW inputs of the memory cells $22n$ through $22n-3$. The column bits are applied to the $B_n$ inputs prior to the ROW enable signal and are latched into the memory cells upon receipt of the ROW enable signal.

FIG. 3 illustrates a first circuit implementation for a memory cell $22_n$. A column input, signal $B_n$, is gated to the input of a CMOS inverter gate 36 and to one electrode of a MOS transmission gate 34 via a MOS transmission gate 30. A ROW input is connected to the input of a CMOS inverter 32, to the gate electrode of the MOS transistor 34, and to the gate electrode of the MOS transistor 30. One electrode of the MOS transistor 34 is connected to the input to a CMOS inverter 38. The output of the memory cell $22_n$ is directed to the gate electrode of an associated MOS transistor 24.

FIG. 4 illustrates a second circuit implementation for a memory cell $22_n$. A MOS transistor 31 has its drain electrode connected to receive the signal $B_n$, its gate electrode is connected to receive the ROW signal and its source electrode is connected to the inputs of CMOS inverters 33 and 35. The outputs from inverter 33 and inverter 35 are connected to the gate electrode of an associated MOS transistor 24.

Referring to FIG. 5, the pixel element 40 is formed on a glass base 41 having an indium-tin-oxide (ITO) layer 42 vacuum deposited thereon. A positive electrode is affixed to layer 42. A first organic layer 43 of an aromatic diamine is vacuum deposited on layer 42.

A second organic layer 44 is a luminescent $ALq_3$ film which is vacuum deposited onto layer 43. An electrode 45, which is an alloy or mixture of magnesium and silver (MgAg), is vacuum deposited onto layer 44. A conductor is connected to layer 45 and to a source of negative potential, with respect to the positive potential of layer 42. The device thus formed is an organic electroluminescent diode which is responsive to d.c. to provide a light output. Such a device is described in detail in an article entitled "Organic Electroluminescent Diodes" by C. W. Tang, Appl. Phys. Lett. 51(12), Sept. 21, 1987, pps 913 and 914.

To form a large scale display a plurality of these elements can be positioned together in a frame type structure or they may be fabricated as either a single or as separate VLSI chips which are interconnected to form the display.

While there has been shown what is considered to be the preferred embodiment of the invention, it will be manifest that many changes and modifications may be made therein without departing from the essential spirit of the invention. It is intended, therefore in the annexed claims to cover all such changes and modifications as fall within the true scope of the invention.

We claim:

1. An electroluminescent storage display with improved intensity driver circuits comprising:
   an electroluminescent element;
   a plurality of memory elements;
   a current source connected in circuit to said electroluminescent element;
   a plurality of elements, corresponding in number to said plurality of memory elements, each connected to a respective memory element and responsive to the signals stored therein for causing an incremental current to flow from said current source to said electroluminescent element; and
   means for applying signals to said memory elements indicative of the intensity desired from said electroluminescent element.

2. The electroluminescent storage display of claim 1 wherein said plurality of elements are MOS transistors each having a gate electrode connected to a respective memory element.

3. The electroluminescent storage display of claim 1 wherein said means for applying signals to said memory elements is comprised of: a plurality of binary bits corresponding in number to said plurality of memory elements and an enabling signal source for providing an enabling signal for loading said binary bits into said memory elements.

4. An electroluminescent storage display with improved intensity driver circuits comprising:
 a column data register means having an input for serially receiving image signals, and having a plurality of parallel outputs for providing said image signals thereon;
 an input/output logic means responsive to an enable signal, and coupled to the plurality of parallel outputs of said column data register means for gating said image signals to respective column outputs;
 a row strobe register means responsive to an input signal for sequentially providing an enabling strobe signal on each of a plurality of row outputs;
 a plurality of switch means, each connected to a respective one of a plurality of row outputs of said row strobe register means for connecting a respective one of said column outputs of said input/output logic means to a switch output;
 a plurality of memory driver circuit means having an input connected to the switch output of a respective switch means and having an output for providing a current as a function of the image signal received on its input;
 a plurality of electroluminescent display means each connected to an output of a respective memory driver circuit means for illumination by the provided current therefrom wherein each of said plurality of memory driver circuit means is comprised of:
 a plurality of memory elements;
 a current source connected in circuit to an electroluminescent display means;
 a plurality of elements corresponding in number to said plurality of memory elements, each connected to a respective memory element and responsive to the signals stored therein for causing an incremental current to flow from said current source to said electroluminescent display means; and
 means for applying signals to said memory elements indicative of the intensity desired from said electroluminescent display means.

5. The electroluminescent storage display of claim 4 wherein said plurality of elements are MOS transistors each having a gate electrode connected to a respective memory element.

6. The electroluminescent storage display of claim 4 wherein said means for applying signals to said memory elements is comprised of:
 a plurality of binary bits corresponding in number to said plurality of memory elements and an enabling signal source for providing an enabling signal for loading said binary bits into said memory elements.

7. An electroluminescent display matrix comprising:
 a plurality of electroluminescent elements arranged in a display;
 a plurality of storage means for each of said plurality of electroluminescent elements for receiving binary number signals corresponding to the intensity level desired from an associated electroluminescent element;
 a plurality of current sources each coupled to a respective plurality of said storage means and an associated electroluminescent element for providing a current as a function of the binary number signals stored in said storage means, and wherein each of said plurality of current sources is comprised of:
 a two MOS device current mirror, with the first of said MOS devices connecting said electroluminescent element to a source of power and with the second of said MOS devices connecting said source of power to a selectable current means; and
 a selectable current means connected to said plurality of storage means and responsive to the signals stored therein for causing the current in said second MOS device to be a function of the signals stored in said plurality of storage means.

* * * * *